(12) United States Patent
Wakamiya et al.

(10) Patent No.: US 6,368,985 B1
(45) Date of Patent: Apr. 9, 2002

(54) DUAL TRACK/STEPPER INTERFACE CONFIGURATION FOR WAFER PROCESSING

(75) Inventors: Ted Wakamiya, San Ramon; Vince L. Marinaro, Sunnyvale; Eric R. Kent, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/580,078

(22) Filed: May 30, 2000

(51) Int. Cl.[7] ........................ H01L 21/31; H01L 21/469
(52) U.S. Cl. ........................... 438/780; 396/611
(58) Field of Search ........................ 396/611; 438/780

(56) References Cited

U.S. PATENT DOCUMENTS

| | | | |
|---|---|---|---|
| 5,442,416 A | * 8/1995 | Tateyama et al. | 354/319 |
| 5,455,894 A | 10/1995 | Conboy et al. | 395/82 |
| 5,844,662 A | * 12/1998 | Akimoto et al. | 355/27 |
| 5,960,225 A | * 9/1999 | Fujimoto | 396/611 |
| 5,963,753 A | * 10/1999 | Ohtani et al. | 396/611 |
| 6,117,486 A | * 9/2000 | Yoshihara | 427/240 |
| 6,239,859 B1 | * 5/2001 | Park | 355/27 |

* cited by examiner

*Primary Examiner*—Richard Elms
*Assistant Examiner*—Christian D. Wilson
(74) *Attorney, Agent, or Firm*—Foley & Lardner

(57) ABSTRACT

An apparatus for processing semiconductor wafers includes a single imaging stepper for exposing wafers processed on a first track and a second track. A method for processing semiconductor wafers includes selecting one of a first coater and a second coater for coating a first wafer with a photoresist. The coated wafer is exposed in a single stepper to form an exposed wafer. An operator selects one of a first developer and second developer to develop the exposed wafer.

20 Claims, 1 Drawing Sheet

DUAL TRACK/STEPPER INTERFACE CONFIGURATION FOR WAFER PROCESSING

FIELD OF THE INVENTION

The present invention relates generally to a method and apparatus for manufacturing a semiconductor integrated circuit ("IC"). More specifically, this invention relates to an improved method and apparatus for processing semiconductor wafers with a dual track and stepper.

BACKGROUND OF THE INVENTION

The present invention applies particularly to the fabrication of semiconductor integrated circuits. Some examples of these semiconductor integrated circuits comprise non-volatile memory integrated circuits. Non-volatile memory integrated circuits include an EPROM, an EEPROM, a flash memory device, and a complementary metal oxide silicon ("CMOS") type device. Exemplary devices may comprise field-effect transistors ("FET") containing a gate over gate insulator over silicon ("MOSFET"), as well as other ultra-large-scale integrated-circuit ("ULSI") systems.

Integrated circuits are utilized in a wide variety of commercial and military electronic devices, including, e.g., hand held telephones, radios and digital cameras. The market for these electronic devices continues to demand devices with a lower voltage, lower power consumption and a decreased chip size. Also, the demand for greater functionality is driving the "design rule" lower, for example, into the sub-half micron range.

These integrated circuit devices are generally fabricated in groups on a semiconductor wafer. During fabrication, a photolithographic process is utilized to form various components and structures. The components and structures are formed according to a photolithographic pattern provided on the semiconductor wafer. This photolithographic process is conventionally utilized in the front end portion of a semiconductor wafer production. There are three basic steps involved in the photolithography processing of each semiconductor wafer. First, a photoresist is applied to each wafer in a coater. Each wafer is then exposed to a radiation source in a stepper, and finally each exposed wafer is developed in a photoresist developer. Since the IC are typically multilayered, this process is repeated a number of times.

More specifically, in a portion of the photolithography of these wafers, a photoresist coater and developer system is utilized in the patterning of various layers of the wafer that will form the circuit device. The photoresist coater and developer system applies, or coats, a light-sensitive resin, i.e., a photoresist layer, to wafers by depositing a pre-selected amount of the photoresist solution. Next, the system spins the wafers at a relatively high rate of speed to distribute the photoresist into a relatively even coating over the wafer. Then, the wafers are baked to induce a volatization of a casting solvent in the photoresist. Next, the wafers are exposed to a light source in a stepper, e.g., a deep ultraviolet ("DUV") light source, for patterning. The exposed wafers are then developed by a chemical treatment, and are again baked to dry the wafers.

Conventional examples of resist coater and developer systems, e.g., are the Tokyo Electron Limited (TEL) sub-half micron compatible Coater/Developer Clean Track systems. Conventional systems may include a chemically amplified resist ("CAR") in the deep ultraviolet ("DUV") process that has been adopted for the sub-half micron design rule type of circuit devices. The combination of the coater and developer is typically referred to as a "track."

As to the development of the photoresist that has been formed on the wafer, conventionally, a chemical developer is utilized to remove areas defined in the steps of masking and exposure of the photoresist layer that has been deposited on the wafer. The development of the photoresist is an important part of the wafer fabrication.

For example, in sub-half micron semiconductor processing, one of the most important parameters in the photolithography area is the critical dimension ("CD"). The above described relatively complex integrated circuits will only function as designed if the critical dimensions are within specification. There are many parameters that control the critical dimension. One of these parameters comprises the time interval between the application of the photoresist in the coater and the exposure of the wafer in the stepper.

Wafers may be processed in either a batch or interface mode. In the batch mode a number (25 for example) wafers may be processed together such that a photoresist is applied to each of the wafers individually. Depending on the process, the time between the application of the photoresist to the first wafer to be processed and the last wafer may be 45 minutes. Once the photoresist has been applied to all of the wafers, each wafer is then individually exposed in the stepper. After all of the wafers have been exposed, then each wafer is developed in the developer.

In the interface mode, each wafer is coated with a photoresist and then sent to the stepper to be exposed. Since the time interval required to expose each wafer in the stepper is less than the time required to apply the photoresist in the coater, no queue develops between the coater and the stepper. However, the time required to develop each wafer is longer than the time required to expose the wafer in the stepper. As a result a queue develops between the stepper and the developer.

As discussed above, IC's are often multi-layered. Accordingly, once the lot of wafers has been processed, the process of photoresist application, exposure, and developing is repeated on the lot until the IC's are completed. The type of photoresist that is applied for each layer of the IC may be different than the previous photoresists that have been applied. Additionally, a different type of photoresist may require a different developer material. For example, a track may include the ability to apply three different photoresists in a single coater, and two different developer materials in the developer. The number of photoresists and developer materials available is a function of the number of nozzles designed into the system. Additionally, a different image is used to expose the wafers for each layer of the IC. The image exposed on the wafer is formed on a reticle used in the imaging process.

Some different photoresists react with one another and coagulate. This can result in clogging the drainage of the coater station. As a result, either the drainage system must be cleaned periodically to prohibit the system from backing up, or the wafers must be processed on a separate track and stepper line.

A typical setup includes a track having a coater and a developer that is connected to a single stepper. The various components communicate via software that coordinates the processing of the wafers in the coater, stepper and developer. A conventional wafer transfer system includes a plurality of cassettes used to store the wafers both before and after they are processed in the coater, stepper or developer. In the batch mode, a group of wafers is stored in a cassette. Automated equipment moves each wafer from the cassette for processing in the given station and then replaced to the cassette when complete. The entire cassette may then be moved manually by an operator to the next station for processing. The entire system may be automated utilizing lateral feeders and conveyor belts, thereby permitting the wafers to be processed in the interface mode.

Alternatively, as described in U.S. Pat. No. 5,455,894, assigned to a common assignee, the wafer transfer system may include a computer controlled robotic interface unit having a robotic arm that moves the wafers without the need for conveyor belts. The '894 patent is included herein by reference.

The cost of the stepper may be six time the cost of the coater and developer track unit. Since the stepper processes the wafers more quickly than the coater and developer, the stepper is often idle. Additionally, maintenance is required on the coater and developer more often than the stepper. Since the stepper is dedicated to a specific track, the stepper will be idled during the periodic maintenance for the track.

Thus, a problem exists in that the most expensive portion of the track and stepper system is idle for a period of time, both during the fabrication of the wafers and during periodic maintenance on the coater and developer units. Additionally, the number of photoresists and developers available are limited due both to the limited number of photoresist nozzles and the coagulation problem. Accordingly, more than one track and stepper line may be required for the processing of the wafers.

Accordingly, it would be desirable to develop a track and stepper system that would permit the timely processing of the wafers, that minimizes the downtime of the stepper, and that provides for a greater number of possible photoresist and developer combinations.

SUMMARY OF THE INVENTION

One embodiment of the invention relates to an apparatus for processing semiconductor wafers. The apparatus includes a first track having a first photoresist coater to apply a photoresist a first wafer. The first track also includes a first developer. A second track includes a second photoresist coater to apply a photoresist to a second wafer. The second track includes a second developer. A stepper integrated with the first and second tracks exposes the first and second wafers.

Another embodiment relates to a method for processing semiconductor wafers including coating a first set of wafers with a photoresist material in a first coater station. The first set of wafers is exposed to a light source in a stepper. The method also includes developing the first set of wafers with a developer in a first developer station. A second set of wafers is coated with a second photoresist material in a second coater station. The second set of wafers is exposed to the light source in the stepper. The method also includes developing the second set of wafers with the developer in the second developer station.

Still a further embodiment includes a method for processing semiconductor wafers comprising first selecting one of a first coater and a second coater. A first wafer is coated with a photoresist from the one of the selected first and second coaters to form a coated wafer. The coated wafer is exposed with an image in a single stepper to form an exposed wafer. One of a first developer and second developer is selected, and the exposed wafer is developed in the selected developer.

These and other benefits and features of the present invention will be apparent upon consideration of the following detailed description of preferred embodiments thereof, presented in connection with the following drawings in which like reference numerals identify like elements throughout.

DETAILED DESCRIPTION OF THE PREFERRED EMBODIMENTS

Figure 1:
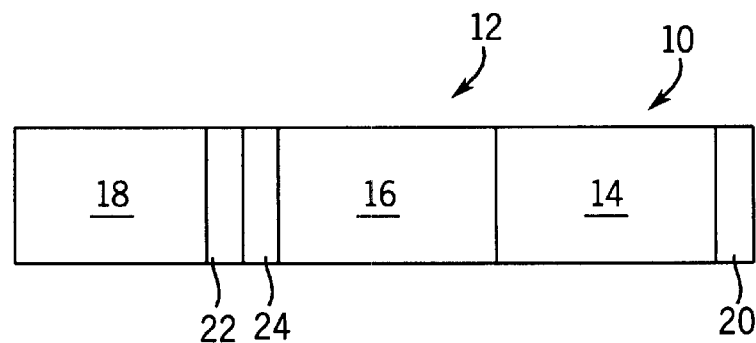
FIG. 1 is a schematic illustration of the prior art apparatus for coating, exposing, and developing wafers with a single track and stepper.

A schematic illustration of an exemplary prior art system 10 for imaging a semiconductor wafer is shown in FIG. 1. The prior art system includes a single track 12 including a coater station 14 for applying a photoresist material to the wafer, and a developer station 16 for developing the wafer after it has been imaged in a stepper 1 8. Typically, the wafers are processed in groups or lots. One lot size could include 25 wafers. In a batch mode, each wafer in the lot is coated individually with the photoresist and stored in an input/output port 20 until all of the wafers in the lot have been covered with the photoresist. Once the wafers have been covered with the photoresist they are moved as a lot to input/output port 22 of the stepper 18. Each coated wafer is then individually exposed with an image formed on a reticle. After all of the wafers have been exposed in the stepper 18, each of the exposed wafers are moved to the input/output port 24 to be individually developed in the developer 16. Each input/output port 20, 22 and 24 can include a cassette for receiving each of the wafers.

The wafers are moved from station to station either by manually moving the cassette, or the wafers can be moved from station to station with an automated transfer system.

In an attempt to control the critical dimension of the sub micron circuit, the wafers are processed in an interface mode to minimize the time the photoresist sits on the wafers prior to exposure in the stepper 18 and subsequent developing in the developer 16.

In the interface mode, once each wafer has been coated in the coater 14 it is immediately forwarded to the stepper 18 to be exposed. Once each wafer has been exposed they are stored in the input/output port 24 and subsequently developed in a developer station 16.

In the prior art system shown in FIG. 1, a single stepper is interfaced physically with a single track including one coater and one developer. The stepper and track are controlled via a computer interface. Where a second set of wafers to be processed requires a different photoresist, or reticle, or developer, the prior art system does not permit the second set of wafers to be coated until all of the first set of wafers have been coated, stepped and developed.

Figure 2:
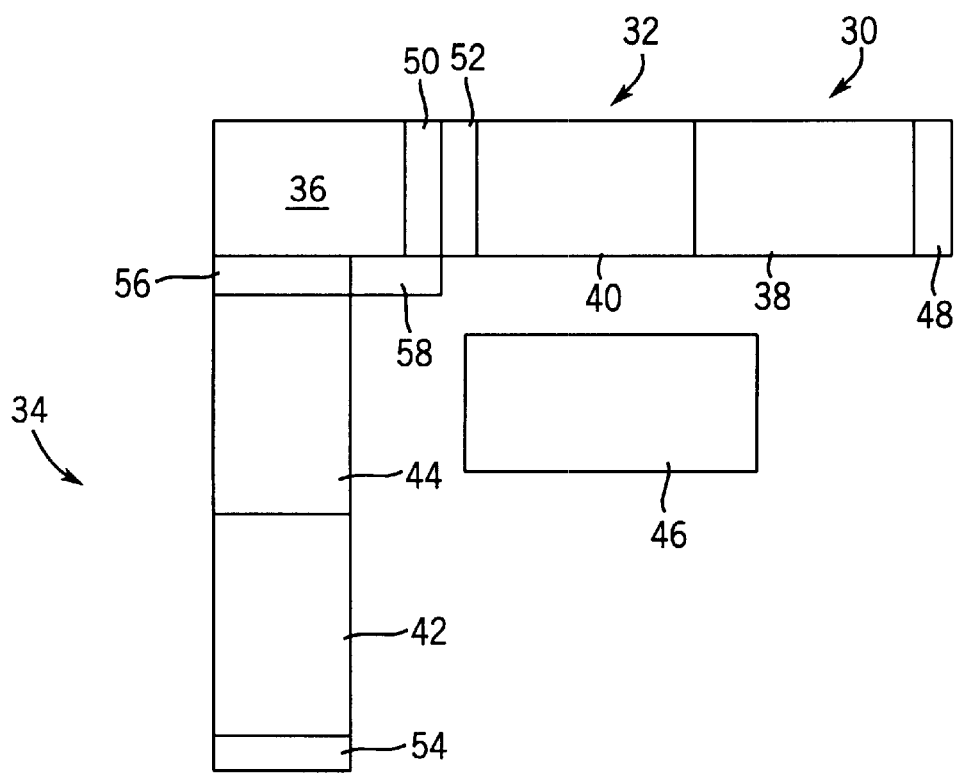
FIG. 2 is a schematic illustration of the apparatus for coating, exposing, and developing wafers in a dual track and single stepper arrangement.

An exemplary embodiment of the present invention is schematically illustrated in FIG. 2. The apparatus 30 includes a first track 32, a second track 34, and a single stepper 36 interfaced with both the first and second tracks 32, 34. The first track 32 includes a first coater 38 for applying a photoresist to the wafers and a first developer 40 for developing the wafers. The second track 34 includes a second coater 42 for applying a photoresist to wafers and a second developer 44 for developing the wafers once they have been imaged in the stepper 36.

The single stepper 36 is used to expose the wafers that have been coated in both the first and second coaters 38, 42 on the first and second tracks 32, 34 respectively.

The single stepper 36 interfaces with both the first and second coaters 38, 42 as well as the first and second developers 40, 44. A wafer transfer system 46 moves the wafers on the first track from a first input/output port 48 of the first coater 38 to an input/output port 50 of the stepper 36, and from input/output port 50 to an input/output port 52 of the first developer 40. Similarly, the wafer transfer system 46 moves the wafers on the second track 34 from a first input/output port 54 of the second coater 42 to the input/output port 50 of stepper 36 and from input/output port 50 to input/output port 56 of second developer 44. As will be described below the wafer transfer system 46 may also be used to move wafers between the first and second tracks as required. While the wafer transfer system 46 is illustrated as a separate entity in FIG. 2, the wafer transfer system 46 interacts with the first and second tracks as well as the stepper 36. The wafer transfer system 46 could also be an integrated part of the first and second tracks 32, 34 as well as the stepper 36. The wafer transfer system could include a conveyor system to move the wafers from one station to another, or may include a robotic control unit as described in U.S. Pat. No. 5,455,894.

A computer controller and software controls the flow of the wafers to both maximize throughput of the system, permit more photoresist and developer combinations, and minimize the time that the stepper is idle during the interface mode.

There are a number of modes of operation in which the system can operate. One mode of operation includes processing a first lot of wafers on the first track 32 and a second lot of wafers on the second track 34, where both of lots of wafers are processed using the same photoresist, the same reticle in the stepper, and the same developer material.

In this mode of operation, both tracks 32, 34 feed coated wafers to the stepper 36. Since the time required to expose a coated wafer to light in the stepper 36 is less than the time required to develop the exposed wafer, the stepper 36 can image the wafers from the first and second tracks 32, 34 alternatively and forward them to the appropriate developer 40, 42. As a result, the idle time of the stepper 36 is reduced.

In another mode of operation, both tracks 32, 34 are run concurrently and employ a different resist/developer combination and or a different imaging reticle. In this mode a first group of wafers are coated on the first track, while a second group of wafers are coated on the second track. Since the reticle used to image the wafers will be different for the first and second groups of wafers, the operator must program the system to recognize which group of wafers to expose first. Where the group of wafers on the first track 32 is to be exposed first, the second group of coated wafers will be held in the input/output port 50 of the stepper until all of the first group of wafers have been exposed, and the reticle is changed.

Additionally, since, the stepper 36 will image the entire first group of wafers one after another; a queue will develop for the first developer. While the wafers are being processed in the first developer the reticle can be changed in the stepper 36 and the second lot of wafers can be exposed and sent to the second developer 44. This represents an improvement over the prior art system in which the stepper was idle during the period in which the developer ran through the queue and completed the developing of all of the wafers.

In yet another mode of operation the first track 32 can be down for periodic maintenance while the second track 34 can continue to process wafers in conjunction with the stepper 36. Similarly, the second track 34 can be down for periodic maintenance while the first track 32 can continue to process wafers in conjunction with the stepper 36.

In still another mode of operation a group of wafers can be coated with one of the three photoresists available in the first coater 38 and then developed in one of the two developer materials available in the second developer 44. Similarly, the group of wafers may be coated with one of the three photoresists in the second coater 42 which may be different than the three photoresists available in the first coater 38, and then developed with one of the two developer materials in the first developer 40. In this manner the number of possible photoresist and developer combinations is greatly enhanced over the prior art single track/stepper configuration. If two coater stations are employed for each track the number of available photoresists may be doubled from six to twelve.

This improved system permits greater number of photoresist and developer combinations and therefore reduces the number of overall track and stepper systems that a manufacturer must employ to manufacture different types of integrated circuit chips. Additionally, as discussed above, since certain photoresist combinations will tend to clog the drainage system, it is possible to separate incompatible photoresist combinations by placing them in different tracks. As discussed above, the dual track with a common integrated stepper reduces the cost of the overall operation.

Further, it is possible to process a greater number of wafers utilizing a single stepper in this system and minimize the time that each coated wafer must wait to be exposed. The downtime required for periodic maintenance of the stepper is limited to the actual time required to service the stepper itself and not the time required to attend to the coater and developer stations.

Depending on the particular mode of operations, various wafer transfer systems may be utilized. The wafer transfer system as described in the '894 patent may be modified to permit both the tracking of the individual wafers within a single coater/developer track and stepper as well as the ability to move the wafers from a first track to a second track for processing as required. The wafer transfer system will include an input device such as a keyboard to permit an operator to instruct the system on the mode of operation, including the photoresist to be applied, the reticle used for imaging and the type of developer to be used for each layer. A computer controller will direct a robotic interface to move the individual wafers to the appropriate first or second coater, and to the appropriate first or second developer based on the type of photoresist, and developer combination. The controller will also keep track of each wafer within a given lot and display the status and location of the lots being processed.

Based on the mode of operation selected, software will determine the order in which the lots of wafers will be processed. The controller will permit the automated processing of the first and second lots of wafers as discussed above, thereby minimizing the idle time of the stepper, maximizing the throughput of the wafers in the least amount of time, and providing for a greater number of photoresist and developer combinations.

The invention has been described in reference to particular embodiments as set forth above. However, only the preferred embodiment of the present invention, and but a few examples of its versatility are shown and described in the present disclosure. It is understood that the present invention is capable of use in various other combinations and environments, and is capable of changes or modifications within the scope of the inventive concept as expressed herein. Also, many modifications and alternatives will become apparent to one of skill in the art without departing from the principles of the invention as defined by the appended claims.

What is claimed is:

1. A method for processing semiconductor wafers comprising:

providing a first coater and developer track having a first coater station and a first developer station;

providing a second coater and developer track having a second coater station and a second developer station;

providing a single stepper between the first coater and developer track and the second coater and developer track;

coating a first set of wafers with a photoresist material in the first coater station;

exposing the first set of wafers with a light source in the stepper;

developing the first set of wafers with a developer in the first developer station;

coating a second set of wafers with a second photoresist material in the second coater station;

exposing the second set of wafers with the light source in the stepper; and developing the second set of wafers with the developer in the second developer station.

2. The method of claim 1, wherein coating the first set of wafers and coating the second set of wafers occurs concurrently.

3. The method of claim 2, wherein exposing the first set of wafers in the stepper occurs before exposing the second set of wafers in the stepper and further including holding the second set of wafers in a queue until the first set of wafers have been exposed.

4. The method of claim 2, wherein exposing the first set of wafers and exposing the second set of wafers includes exposing each individual wafer of the first and second set of wafers in the order in which the wafers were coated.

5. The method of claim 2, wherein exposing the first set of wafers and exposing the second set of wafers includes exposing at least one of the second set of wafers before all of the first set of wafers have been exposed.

6. The method of claim 1, further including moving the first set of wafers and second set of wafers with a wafer transfer system between the first track and the stepper, and the second track and the stepper respectively.

7. The method of claim 1, further including selecting a photoresist/developer combination for the coating and developing of each of the first and second sets of wafers.

8. A method for processing semiconductor wafers comprising:

providing a first track having a first coater and a first developer connected to and adjacent the first coater;

providing a second track having a second coater and a second developer connected to and adjacent the second coater;

providing a single stepper between the first track and the second track;

selecting one of the first coater and the second coater;

coating a first wafer with a photoresist from the one of the selected first and second coaters to form a coated wafer;

exposing the coated wafer with an image in the single stepper to form an exposed wafer; and selecting one of the first developer and second developer;

developing the exposed wafer in the one of the selected first developer and second developer.

9. The method of claim 8, wherein the first wafer is coated with the first coater, and developed with the second developer.

10. The method of claim 8, further including conducting periodic maintenance on one of the first and second coater and developers while coating and developing the wafer with the other of the first and second coater and developers.

11. The method of claim 8 further including coating a second wafer with a photoresist in the other of the first and second coater to form a second coated wafer.

12. The method of claim 11, further including exposing the second coated wafer with the stepper after exposing the first coated wafer.

13. The method of claim 12, further including moving the first and second wafer with a wafer transfer system.

14. The method of claim 13, further including tracking the location of the first and second wafers through the process based on a predetermined input by an operator.

15. A method for processing semiconductor wafers comprising:

providing a first coater/developer track having a first coater station and a first developer station;

providing a second coater/developer track having a second coater station and a second developer station;

arranging the first and second coater/developer tracks perpendicular to one another such that they form an "L" shape;

providing a single stepper adjacent one end of the first coater/developer track and adjacent one end of the second coater/developer track;

coating a first set of wafers with a first photoresist material in the first coater station;

coating a second set of wafers with a second photoresist material in the second coater station; and alternatingly exposing one of the wafers of the first set of wafers and one of the wafers of the second set of wafers with a light source in the stepper.

16. The method of claim 15, wherein the first photoresist material and the second photoresist material are different.

17. The method of claim 15, further including storing each wafer from the first set of wafers in a queue after coating each wafer from the first set of wafers and storing each wafer from the second set of wafers in the queue after coating each wafer from the second set of wafers.

18. The method of claim 17 further including moving each wafer after it has been exposed from the stepper to the queue.

19. The method of claim 18 wherein each wafer is moved from and to the queue with a wafer transfer system.

20. The method of claim 19, wherein each coated wafer is developed in one of the first and second developer stations.

* * * * *